United States Patent
Han

(10) Patent No.: US 9,123,676 B2
(45) Date of Patent: Sep. 1, 2015

(54) ORGANIC LIGHT-EMITTING DISPLAY APPARATUS HAVING SHOCK ABSORPTION AND SEALING MEMBERS

(71) Applicant: SAMSUNG DISPLAY CO., LTD., Yongin, Gyeonggi-Do (KR)

(72) Inventor: Byung-Uk Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/252,272

(22) Filed: Apr. 14, 2014

(65) Prior Publication Data

US 2015/0041772 A1 Feb. 12, 2015

(30) Foreign Application Priority Data

Aug. 8, 2013 (KR) .................. 10-2013-0094334

(51) Int. Cl.
*H01L 27/32* (2006.01)
*H01L 51/56* (2006.01)
*H01L 51/52* (2006.01)

(52) U.S. Cl.
CPC ........ *H01L 27/3248* (2013.01); *H01L 51/5246* (2013.01); *H01L 51/56* (2013.01)

(58) Field of Classification Search
CPC .......................... H01L 27/3262; H01L 51/56
See application file for complete search history.

(56) References Cited

U.S. PATENT DOCUMENTS

| 6,683,671 | B1 * | 1/2004 | Morimoto | 349/155 |
| 6,819,389 | B2 * | 11/2004 | Imayama et al. | 349/153 |
| 7,369,209 | B2 * | 5/2008 | Kinoshita et al. | 349/158 |
| 7,433,014 | B2 * | 10/2008 | Kim et al. | 349/190 |
| 7,531,833 | B2 * | 5/2009 | Kim et al. | 257/40 |
| 7,567,333 | B2 * | 7/2009 | Lee et al. | 349/156 |
| 7,777,858 | B2 * | 8/2010 | Yoo et al. | 349/156 |
| 8,310,609 | B2 * | 11/2012 | Yoshida et al. | 349/40 |
| 8,884,849 | B2 * | 11/2014 | Masuda | 345/76 |
| 2003/0025868 | A1 * | 2/2003 | Hiroshima et al. | 349/156 |
| 2004/0263766 | A1 * | 12/2004 | Lee et al. | 349/156 |
| 2005/0161740 | A1 * | 7/2005 | Park et al. | 257/347 |
| 2009/0079928 | A1 * | 3/2009 | Ohashi et al. | 349/156 |
| 2012/0169229 | A1 * | 7/2012 | You et al. | 315/51 |
| 2012/0248466 | A1 | 10/2012 | Park | |

(Continued)

FOREIGN PATENT DOCUMENTS

KR  10-0759098 B1  9/2007
KR  10-2008-0084491 A  9/2008

(Continued)

*Primary Examiner* — Ida M Soward
(74) *Attorney, Agent, or Firm* — Lee & Morse, P.C.

(57) ABSTRACT

An OLED apparatus including a lower substrate including a display and peripheral area, the peripheral area surrounding the display area; a TFT on the lower substrate; a pixel electrode electrically connected to the TFT; a pixel defining layer covering an edge of the pixel electrode and exposing a central portion of the pixel electrode; an intermediate layer on the pixel electrode and including an emission layer; an opposite electrode overlying the pixel electrode; an upper substrate overlying the lower substrate; a sealing member on the peripheral area and attaching the lower substrate to the upper substrate; and a shock absorption member including a first layer on the peripheral area, the first layer being separated from the sealing member and stacked in a layer stack structure on the lower substrate; and a second layer on the first layer and including a same material as the pixel defining layer.

10 Claims, 13 Drawing Sheets

(56) References Cited

U.S. PATENT DOCUMENTS

| | | | |
|---|---|---|---|
| 2012/0305922 A1* | 12/2012 | Yamazaki | 257/59 |
| 2012/0327347 A1* | 12/2012 | Cho et al. | 349/138 |
| 2013/0049003 A1* | 2/2013 | Choi et al. | 257/72 |
| 2013/0099218 A1 | 4/2013 | Lee et al. | |
| 2015/0034937 A1* | 2/2015 | Ikeda et al. | 257/40 |

FOREIGN PATENT DOCUMENTS

| | | |
|---|---|---|
| KR | 10-2012-0077470 A | 7/2012 |
| KR | 10-2012-0109843 A | 10/2012 |
| KR | 10-2013-0025806 A | 3/2013 |

\* cited by examiner

ORGANIC LIGHT-EMITTING DISPLAY APPARATUS HAVING SHOCK ABSORPTION AND SEALING MEMBERS

CROSS-REFERENCE TO RELATED APPLICATION

Korean Patent Application No. 10-2013-0094334, filed on Aug. 8, 2013, in the Korean Intellectual Property Office, and entitled: "Organic Light-Emitting Display Apparatus and Method Of Manufacturing The Same," is incorporated by reference herein in its entirety.

BACKGROUND

1. Field

Embodiments relate to an organic light-emitting display apparatus and a method of manufacturing the same.

2. Description of the Related Art

An organic light-emitting display apparatus has high-grade characteristics, such as wide viewing angles, high contrast, and fast response times. Therefore, the organic light-emitting display apparatus is considered as a next-generation display apparatus.

SUMMARY

Embodiments are directed to an organic light-emitting display apparatus and a method of manufacturing the same.

The embodiments may be realized by providing an organic light-emitting display apparatus including a lower substrate including a display area and a peripheral area, the peripheral area surrounding the display area; a thin film transistor (TFT) on the lower substrate; a pixel electrode electrically connected to the TFT; a pixel defining layer covering an edge of the pixel electrode so that a central portion of the pixel electrode is exposed; an intermediate layer on the pixel electrode, the intermediate layer including an emission layer; an opposite electrode overlying the pixel electrode; an upper substrate overlying the lower substrate; a sealing member on the peripheral area of the lower substrate, the sealing member attaching the lower substrate to the upper substrate; and a shock absorption member, the shock absorption member including a first layer on the peripheral area of the lower substrate, the first layer being separated from the sealing member and being stacked in a layer stack structure on the lower substrate; and a second layer on the first layer, the second layer including a same material as the pixel defining layer.

The first layer of the shock absorption member may have a layer stack structure including layers formed of the same materials as layers included in the TFT, and the shock absorption member may further include a metal layer between the first layer and the second layer, the metal layer including a same material as the pixel electrode.

The shock absorption member may further include a third layer on the second layer, the third layer including a same material as the opposite electrode.

The shock absorption member may be between the sealing member and the display area.

The sealing member may be between the shock absorption member and the display area.

The shock absorption member may include a pair of shock absorption members, the sealing member may be between the pair of shock absorption members, and one of the shock absorption members may be between the sealing member and the display area.

The shock absorption member may surround the display area of the lower substrate.

The shock absorption member may be discontinuously disposed around the display area of the lower substrate.

The embodiments may be realized by providing an organic light-emitting display apparatus including a lower substrate including a display area and a peripheral area, the peripheral area surrounding the display area; an upper substrate overlying the lower substrate; a sealing member on the peripheral area of the lower substrate, the sealing member attaching the lower substrate to the upper substrate; and a shock absorption member on the peripheral area of the lower substrate, the shock absorption member being separated from the sealing member, contacting the upper substrate, and having a same layer structure as a layer structure between the lower substrate and the upper substrate within the display area of the lower substrate.

The shock absorption member may have a same layer structure as a structure of a portion having a maximum layer structure between the lower substrate and the upper substrate within the display area of the lower substrate.

The embodiments may be realized by providing a method of manufacturing an organic light-emitting display apparatus, the method including preparing a lower substrate including a display area and a peripheral area such that the peripheral area surrounds the display area; forming a thin film transistor (TFT) on the lower substrate; forming a pixel electrode electrically connected to the TFT; forming a pixel defining layer covering an edge of the pixel electrode such that a central portion of the pixel electrode is exposed; forming an intermediate layer on the pixel electrode such that the intermediate layer includes an emission layer; forming an opposite electrode corresponding to the pixel electrode; forming a sealing member in the peripheral area of the lower substrate; forming a shock absorption member such that the shock absorption member includes a first layer on the peripheral area of the lower substrate, the first layer being separated from the sealing member and having a layer stack structure; and a second layer on the first layer, the second layer including a same material as the pixel defining layer; and attaching the upper substrate to the lower substrate through the sealing member.

Forming the shock absorption member may include forming the first layer having a layer stack structure; and forming the second layer on the first layer, wherein forming the first layer is performed simultaneously with forming the TFT on the lower substrate.

Forming the shock absorption member may further include forming a metal layer simultaneously with the pixel electrode, between forming the first layer and forming the second layer.

Forming the shock absorption member may further include forming a third layer on the second layer simultaneously with forming the opposite electrode.

The second layer may be formed simultaneously with the pixel defining layer by using a half-tone mask.

The shock absorption member may be formed at an inner side of the sealing member such that the shock absorption member is between the sealing member and the display area.

The shock absorption member may be formed at an outer side of the sealing member such that the sealing member is between the shock absorption member and the display area.

Forming the shock absorption member may include forming a pair of shock absorption members, such that the sealing member is between the pair of shock absorption members, and one of the shock absorption members is between the sealing member and the display area.

The shock absorption member may surround the display area of the lower substrate.

The shock absorption member may be discontinuously disposed around the display area of the lower substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
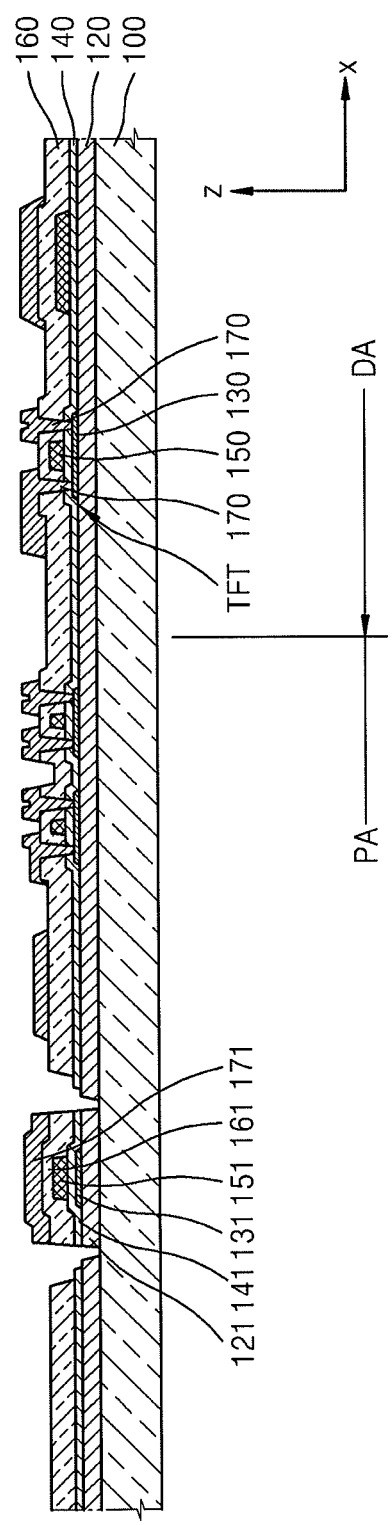
FIGS. 1 to 5 illustrate cross-sectional views of stages in a method of manufacturing an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that when a layer, region, or component is referred to as being "formed on," another layer, region, or component, it can be directly or indirectly formed on the other layer, region, or component. For example, intervening layers, regions, or components may be present.

As used herein, the term "and/or" includes any and all combinations of one or more of the associated listed items. Expressions such as "at least one of," when preceding a list of elements, modify the entire list of elements and do not modify the individual elements of the list.

FIGS. 1 to 5 illustrate cross-sectional views of stages in a method of manufacturing an organic light-emitting display apparatus according to an embodiment.

A lower substrate 100 may be prepared. The lower substrate 100 may have a display region DA and a peripheral area PA that surrounds the display area DA. The display area DA may be an area where organic light-emitting devices 200 are disposed, and the peripheral area PA (surrounding the display area DA) may be a dead space where no display is performed. A driving unit (that applies electric signals to the display area DA) may be disposed in the peripheral area PA. The lower substrate 100 may be formed of, e.g., a glass material, a metal material, and/or a plastic material. An upper substrate 500, which is to be described below, may also be formed of the same material as the lower substrate 100.

As illustrated in FIG. 1, a thin film transistor (TFT) may be formed on the lower substrate 100. In the forming of the TFT, after a buffer layer 120 is formed of, e.g., silicon oxide or silicon nitride, on the lower substrate 100, a semiconductor layer 130 may be formed on the buffer layer 120 so as to planarize a surface of the lower substrate 100 and/or to help reduce the likelihood of or prevent foreign substances from penetrating into the semiconductor layer 130.

A gate insulating film 140 may be formed of, e.g., silicon oxide and/or silicon nitride, on the semiconductor layer 130. The gate insulating film 140 may insulate between the semiconductor layer 130 and a gate electrode 150 (to be described below). A gate electrode 150 may be formed on the semiconductor layer 130. Source and drain electrodes 170 may be electrically connected according to a signal applied to the gate electrode 150. In consideration of adhesion to an adjacent layer, surface flatness of a stacked layer, and processability, the gate electrode 150 may be a single layer or a layer stack formed of or including at least one of, e.g., aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

An interlayer insulating film 160 may be formed on the gate electrode 150. The interlayer insulating film 160 may be a single layer or a layer stack formed of or including any one of silicon oxide or silicon nitride.

Source and drain electrodes 170 may be formed on the interlayer insulating film 160. The source and drain electrodes 170 may be electrically connected to the semiconductor layer 130 through contact holes in the interlayer insulating film 160 and the gate insulating film 140. In consideration of conductivity, the source and drain electrodes 170 may be a single layer or a layer stack formed of or including at least one of, e.g., aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

A shock absorption member 300 may be formed on the peripheral area PA (surrounding the display area DA) of the lower substrate 100 at the same time as the formation of the TFT on the display area DA of the lower substrate 100. This will be described below in detail.

Figure 2:
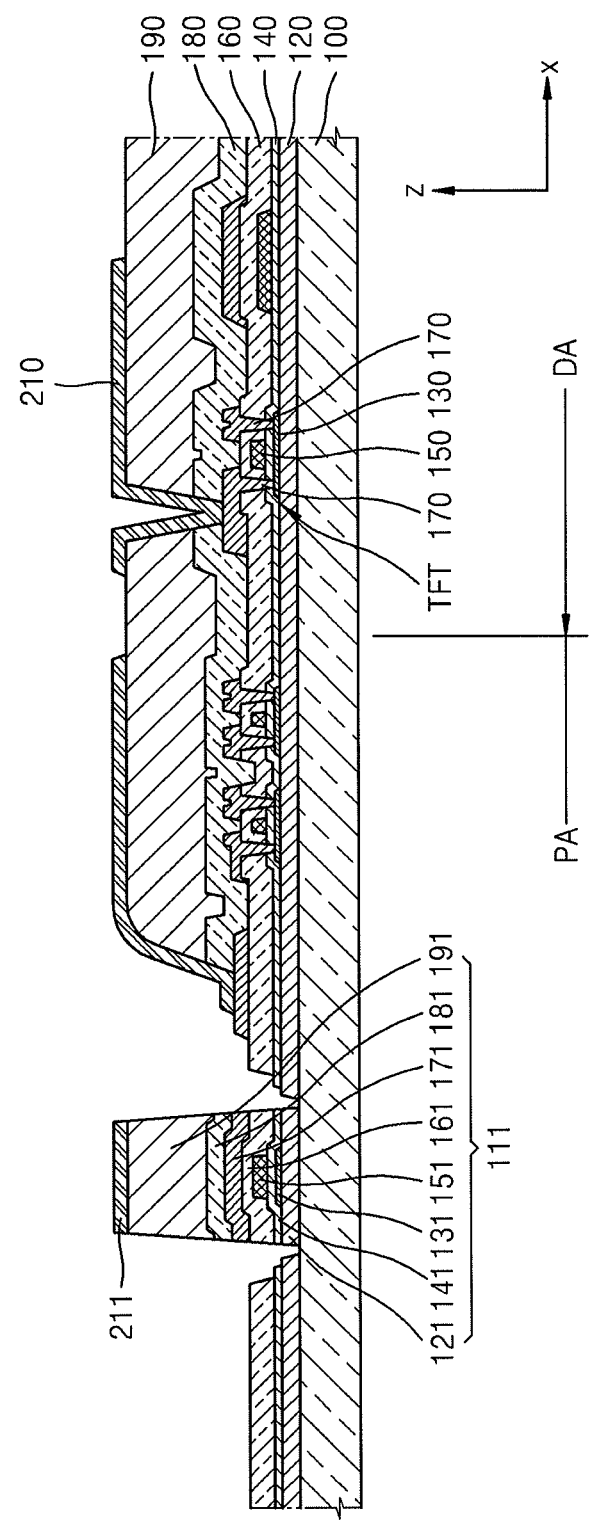

As illustrated in FIG. 2, a first insulating film 180 may be formed on the TFT as a protection film that covers the TFT, so as to protect the TFT having the above-described structure. The first insulating film 180 may be formed of or may include an inorganic material, e.g., silicon oxide, silicon nitride, or silicon oxynitride. In an implementation, the first insulating film 180 may have a single layer as shown in FIG. 2. In an implementation, the first insulating film 180 may have a layer stack structure.

After the first insulating film 180 is formed, a second insulating film 190 may be formed on the first insulating film 180, if desired. In this case, the second insulating film 190 may be a planarization film or a protection film. For example, when an organic light-emitting device 200 is disposed on the TFT as illustrated, the second insulating film 190 may be a planarization film for planarizing a top surface of the first insulating film 180 that covers the TFT. The second insulating film 190 may be formed of or may include, e.g., an acryl-based organic material or benzocyclobutene (BCB). In an implementation, the second insulating film 190 may have a single layer as shown in FIG. 2. In an implementation, the first insulating film 180 may have a layer stack. After the first insulating film 180 and the second insulating film 190 are formed, the first insulating film 180 and the second insulating film 190 may be patterned to form via holes connected to the source and drain electrodes 170 of the TFT. In this manner, a pixel electrode 210 may be electrically connected to the electrode of the TFT.

In the display area DA of the lower substrate 100, a pixel electrode 210 may be formed on the second insulating film 190 to cover and/or fill the via holes on the first insulating film 180 and the second insulating film 190. The pixel electrode 210 may be formed as a translucent or transparent electrode or as a reflective electrode. When the pixel electrode 210 is the translucent or transparent electrode, the pixel electrode 210 may be formed of or may include, e.g., any one of indium thin oxide (ITO), indium zinc oxide (IZO), zinc oxide (ZnO), indium oxide ($In_2O_3$), indium gallium oxide (IGO), and aluminum zinc oxide (AZO). When the pixel electrode 210 is the reflective electrode, the pixel electrode 210 may include a reflection film formed of or including, e.g., any one of silver (Ag), magnesium (Mg), aluminum (Al), platinum (Pt), palladium (Pd), gold (Au), nickel (Ni), neodymium (Nd), iridium (Ir), chromium (Cr), and alloys thereof, and a layer formed of or including, e.g., any one of indium thin oxide (ITO), indium zinc oxide (IZO), zinc oxide (ZnO), indium oxide ($In_2O_3$), indium gallium oxide (IGO), and aluminum zinc oxide (AZO). In an implementation, the pixel electrode 210 may be formed of or may include various suitable materials. In an implementation, the pixel electrode 210 may be a single layer or a layer stack.

As described above, the shock absorption member 300 may be formed on the peripheral area PA (surrounding the display area DA) of the lower substrate 100 at the same time as the formation of the first insulating film 180 and the second insulating film 190 covering the TFT on the display area DA of the lower substrate 100. The forming of the shock absorption member 300 may include forming a first layer 111 having a layer stack structure, and forming a second layer 241 on the first layer 111. The shock absorption member 300 may be formed on the lower substrate 100 such that the shock absorption member 300 is separated or spaced apart from a sealing member (440 in FIG. 5) by a predetermined distance. The first layer 111 may be formed at the same time as the formation of the TFT. Therefore, the first layer 111 may include layers that are the same as or analogous to those formed in the display area DA.

For example, as illustrated in FIG. 2, the first layer 111 of the shock absorption member 300 may include a buffer layer 121, a semiconductor layer 131, a gate insulating film 141, a gate electrode layer 151, an interlayer insulating film 161, source and drain electrode layers 171, a first insulating film 181, and a second insulating film 191. The buffer layer 121 may be formed simultaneously with the buffer layer 120 of the display area DA. The semiconductor layer 131 may be formed simultaneously with the semiconductor layer 130 of the display area DA. The gate insulating film 141 may be formed simultaneously with the gate insulating film 140 of the display area DA. The gate electrode layer 151 may be formed simultaneously with the gate electrode 150 of the display area DA. The interlayer insulating film 161 may be formed simultaneously with the interlayer insulating film 160 of the display area DA. The source and drain electrode layers 171 may be formed simultaneously with the source and drain electrodes 170 of the display area DA. The first insulating film 181 and the second insulating film 191 may be formed simultaneously with the first insulating film 180 and the second insulating film 190 of the display area DA. For example, the buffer layers 120 and 121, the gate insulating films 140 and 141, the interlayer insulating films 160 and 161, the first insulating films 180 and 181, and the second insulating films 190 and 191 may be formed on an entire surface of the lower substrate 100, and then may be patterned to form the buffer layer 121, the interlayer insulating film 161, the first insulating film 181, and the second insulating film 191 that are physically separated from the buffer layer 120, the interlayer insulating film 160, the first insulating film 180, and the second insulating film 190 within the display area DA. In this manner, the first layer 111 of the shock absorption member 300 may be formed. A metal layer 211 may be formed on the first layer 111 at the same time as the formation of the pixel electrode 210.

Figure 3:
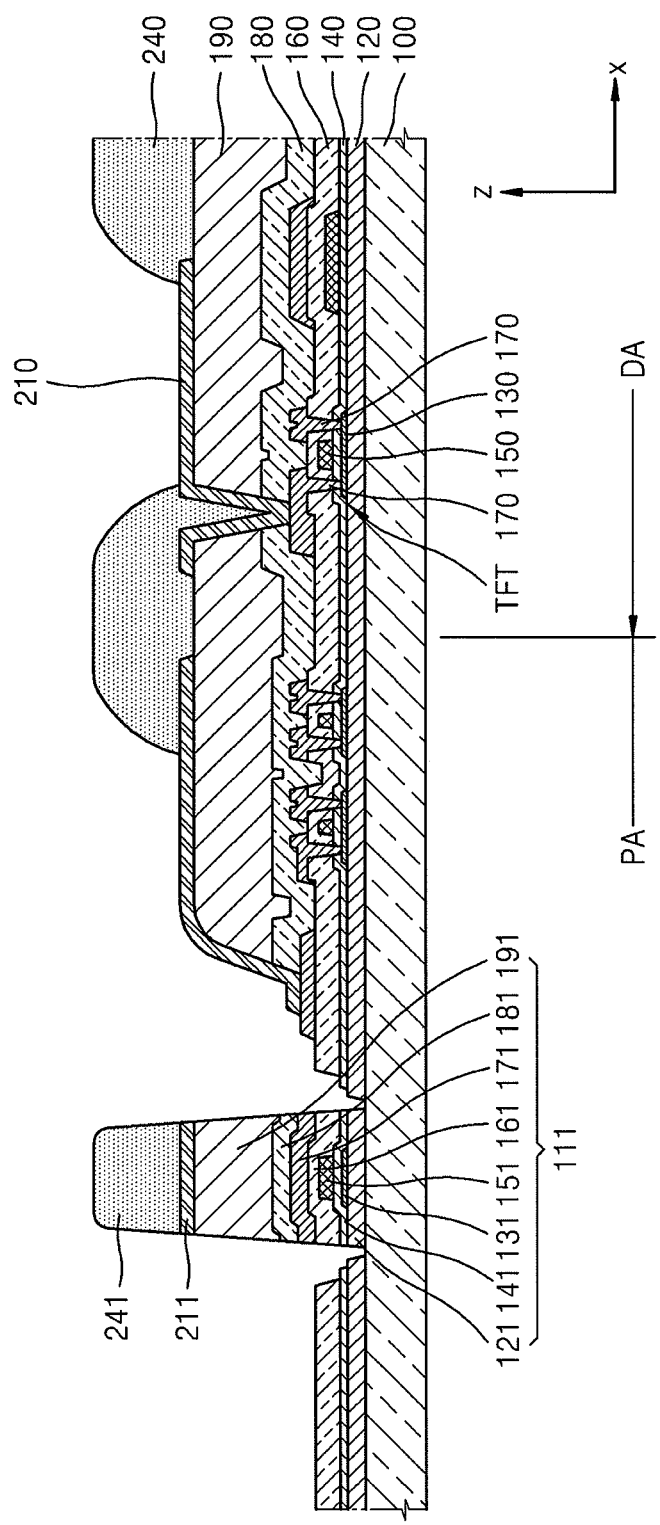
Figure 4:
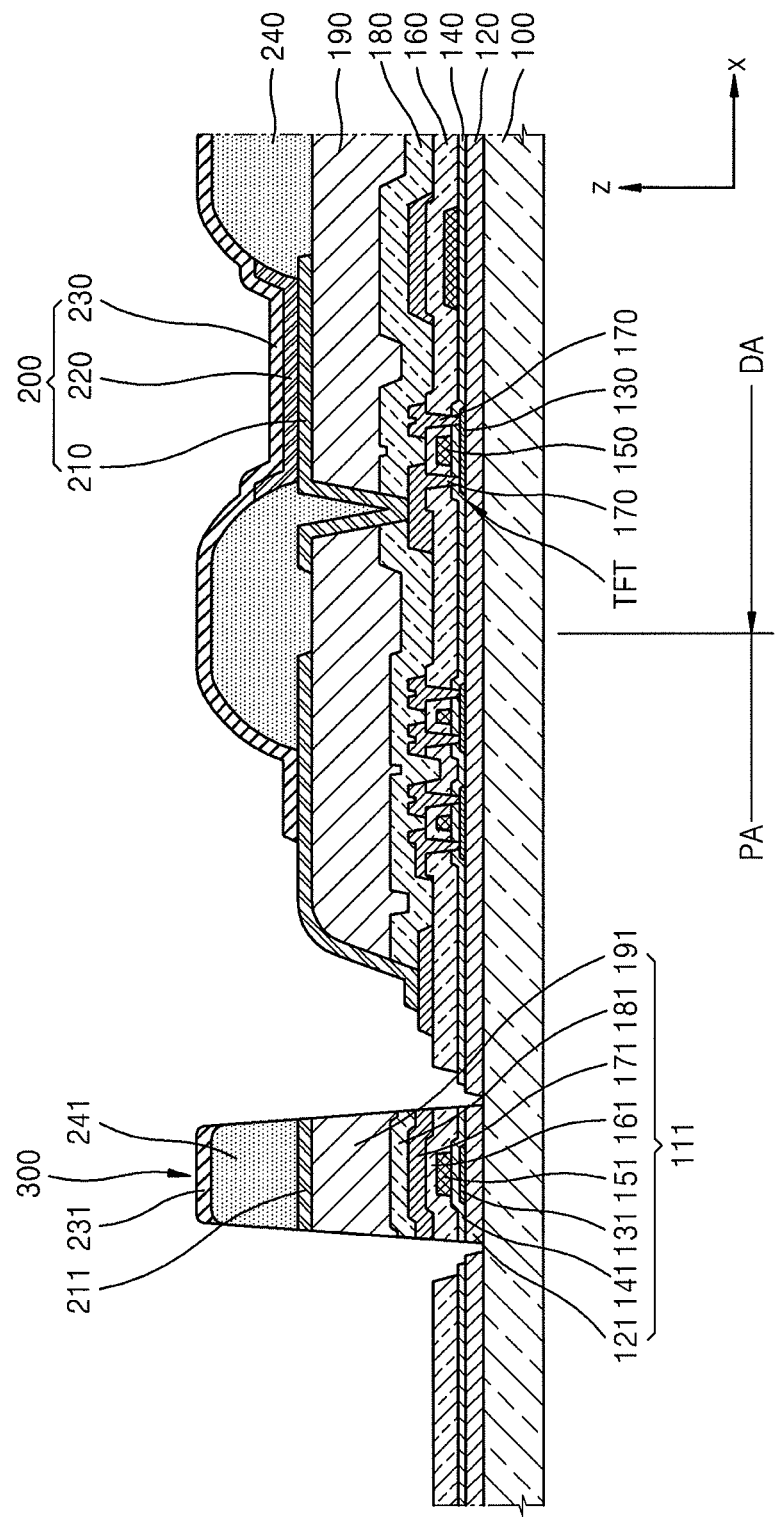

Referring to FIGS. 3 and 4, a pixel defining layer 240 may be formed on the pixel electrode 210 in the display area DA of the lower substrate 100. The pixel defining layer 240 may define pixels by including openings corresponding to sub-pixels, e.g., openings covering edges of the pixel electrode 210 and exposing at least central portions thereof. In addition, as illustrated in FIG. 4, the pixel defining layer 240 may increase a distance between or may space apart an end portion of the pixel electrode 210 and an opposite electrode 230 on the pixel electrode 210, thereby reducing the likelihood of and/or preventing an arc or the like from occurring at the end portion of the pixel electrode 210. The pixel defining layer 240 may be formed of or may include, e.g., an inorganic material such as polyimide.

As described above, the pixel defining layer 240 may define a pixel region and may be formed in the display area DA of the lower substrate 100. As illustrated in FIG. 3, when the pixel defining layer 240 is formed in the display area DA, a second layer 241 may be simultaneously formed as part of the shock absorption member 300. The second layer 241 may include the same material as the pixel defining layer 240. In an implementation, a height of the second layer 241 of the shock absorption member 300 may be different from a height of the pixel defining layer 240. In the case of forming layers included in the first layer 111 of the shock absorption member 300, except for at least one layer, the height of the second layer 241 of the shock absorption member 300 may need to be higher than the height of the pixel defining layer 240, so that a distance from the lower substrate 100 to a top surface of the second layer 241 is about equal to or similar to a distance from the lower substrate 100 to a top surface of the pixel defining layer 240. Thus, in this case, the second layer 241 and the pixel defining layer 240 may be simultaneously formed using a half-tone mask.

As illustrated in FIG. 4, an organic light-emitting device 200 may be formed. The organic light-emitting device 200 may include the pixel electrode 210, the opposite electrode 230, and an intermediate layer 220 (including an emission layer) therebetween. The forming of the organic light-emitting device 200 may include forming the intermediate layer 220 (that includes the emission layer) on the pixel electrode 210, and forming the opposite electrode 230 corresponding to or overlying the pixel electrode 210.

The intermediate layer 220 of the organic light-emitting device 200 may include a low-molecular-weight material or a high-molecular-weight (e.g., polymeric) material. When the intermediate layer 220 includes the low-molecular-weight material, the intermediate layer 200 may be a single layer or a layer stack including, e.g., a hole injection layer (HIL), a hole transport layer (HTL), an emission layer (EML), an electron transport layer (ETL), and/or an electron injection layer (EIL) in a single or multiple structure. The intermediate layer 220 may be formed of various materials including an organic or organometallic material. Examples of the organic or organometallic material may include copper phthalocyanine (CuPc), N,N'-di(naphthalene-1-yl)-N,N'-diphenyl-benzidine (NPB), and tris-8-hydroxyquinoline aluminum ($Alq_3$). These layers may be formed in, e.g., a vacuum evaporation method.

When the intermediate layer 220 includes the high-molecular-weight material, the intermediate layer 220 may include, e.g., the HTL and the EML. In this case, e.g., PEDOT may be used as the HTL, and poly-phenylenevinylene (PPV)-based and/or polyfluorene-based polymer materials may be used as the EML. The HTL and the EML may be formed by, e.g., a screen printing or inkjet printing method or a laser induced thermal image (LITI) method.

The opposite electrode 230 may overlie entire top surfaces of the display area DA and the peripheral area PA (surrounding the display area DA). As illustrated in FIG. 4, the opposite electrode 230 may be cover the display area DA and the peripheral area PA (surrounding the display area DA). For example, the opposite electrode 230 may be integrally formed in the plurality of organic light-emitting devices 200 and may correspond to or overlie a plurality of pixel electrodes 210, e.g., different pixel electrodes 210.

The opposite electrode 230 may be formed as a translucent or transparent electrode or as a reflective electrode. When the opposite electrode 230 is the translucent or transparent electrode, the opposite electrode 230 may include a layer formed of or including, e.g., a metal having a small work function, such as Li, Ca, LiF/Ca, LiF/Al, Al, Ag, Mg, or compounds thereof, and a translucent or transparent conductive layer formed of or including, e.g., any one of ITO, IZO, ZnO, or $In_2O_3$. When the opposite electrode 230 is the reflective electrode, the opposite electrode 230 may include a layer formed of or including, e.g., any one of Li, Ca, LiF/Ca, LiF/Al, Al, Ag, Mg, or compounds thereof.

As described above, as the intermediate layer 220 and the opposite electrode 230 are formed in the display area DA, the shock absorption member 300 may be simultaneously formed. A third layer 231 may be further formed on the second layer 241 of the shock absorption member 300 at the same time as the formation of the opposite electrode 230. For example, the third layer 231 may be formed of the same material as the opposite electrode 230.

After a sealing member 400 is formed in the peripheral area PA of the lower substrate 100, the upper substrate 500 may be attached to the lower substrate 100 through the sealing member 400. The upper substrate 500 may correspond to the lower substrate 100 (e.g., may overlie or may be opposite to the lower substrate 100) and may be formed of or may include various materials, e.g., a glass material, a metal material, or a plastic material. The lower substrate 100 and the upper substrate 500 may be attached to each other through the sealing member 400. The sealing member 400 may be formed of or may include, e.g., frit or epoxy.

Like the sealing member 400, the shock absorption member 300 may be in the peripheral area PA of the lower substrate 100, and may protrude or extend from the lower substrate 100 in a direction (+z) of or toward the upper substrate 500. In an implementation, the shock absorption member 300 may be separated or spaced apart from the sealing member 400.

Figure 5:
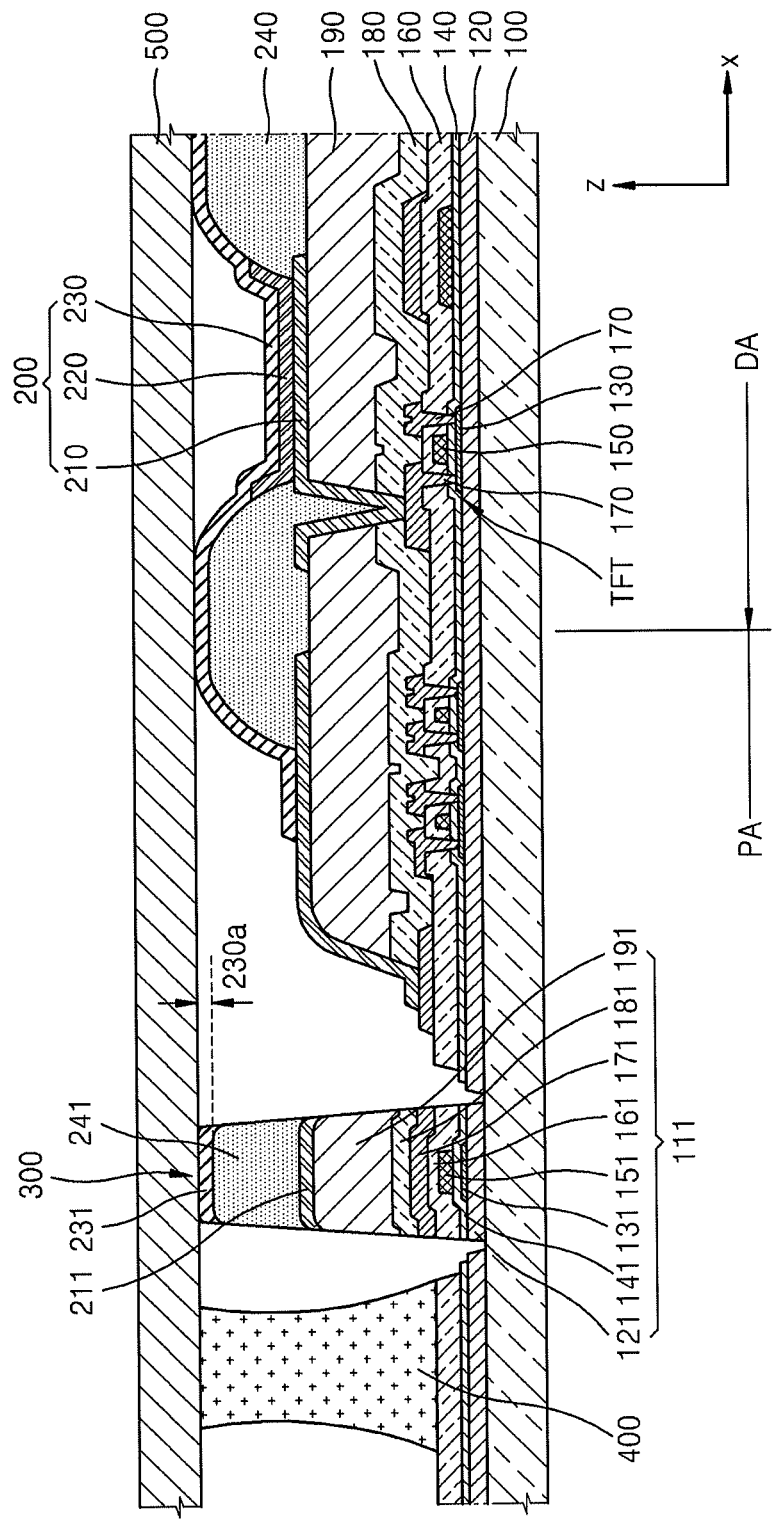

In an implementation, an end portion of the shock absorption member 300 (in the direction of or facing the upper substrate 500) may contact the upper substrate 500 as illustrated in FIG. 5. In an implementation, the end portion of the shock absorption member 300 (in the direction of or facing the upper substrate 500) may not contact or may be spaced apart from the upper substrate 500. For example, the third layer 231 (which is otherwise formable simultaneously with the opposite electrode 230) may not be provided, and a space 230a may exist between the upper substrate 500 and the end portion of the shock absorption member 300 (in the direction of or facing the upper substrate 500).

As described above, the pixel defining layer 240 may be in the display area DA, and the shock absorption member 300 may have the second layer 241 as the uppermost layer, the second layer 241 being formed simultaneously with the pixel defining layer 240.

A distance from the lower substrate 100 to the end portion of the shock absorption member 300 (in the direction of or facing the upper substrate 500) may be equal to or about equal to a distance from the lower substrate 100 to an end portion of the pixel defining layer 240 (in the direction of or facing the upper substrate 500). In this case, the opposite electrode 230 on the pixel defining layer 240 may contact the upper substrate 500, and the space 230a (corresponding to a thickness of the opposite electrode 230) may exist between the upper substrate 500 and the end portion of the shock absorption member 300 (in the direction of or facing the upper substrate 500). The lower substrate 100 or the upper substrate 500 may have a thickness of, e.g., several hundred μm, and the opposite electrode 230 may have a relatively small thickness, e.g., of about 1,000 Å. Therefore, even when the space 230a exists as described above, the end portion of the shock absorption member 300 (in the direction of or facing the upper substrate 500) may be considered as almost or substantially contacting or actually contacting the upper substrate 500 in terms of an entire surface of the organic light-emitting display apparatus.

The shock absorption member 300 in the organic light-emitting display apparatus may absorb external shocks applied to the organic light-emitting display apparatus.

For example, in a case where the organic light-emitting display apparatus is mounted and used in a portable mobile device, when the portable mobile device falls down to the ground, a shock may occur in an edge of the organic light-emitting display apparatus. The shock may cause cracks from the peripheral area PA to the upper substrate 500, resulting in an extension of cracks from the upper substrate 500 to the display area DA.

The shock absorption member 300 in the peripheral area PA, e.g., of the organic light-emitting display apparatus of FIG. 5, may help effectively reduce damage caused by the external shocks. This may significantly reduce a damage rate of the organic light-emitting display apparatus that is caused by external shocks.

In addition, the shock absorption member 300 may be formed simultaneously with the TFT or the organic light-emitting device of the display area DA. Therefore, the shock absorption member 300 (having a significantly low damage rate with respect to external shocks) may be formed without additional processes.

The method of manufacturing the organic light-emitting display apparatus has been described. In an implementation, a suitable organic light-emitting display apparatus manufactured by the above-described manufacturing method will also fall within the scope of the present invention.

Figure 6:
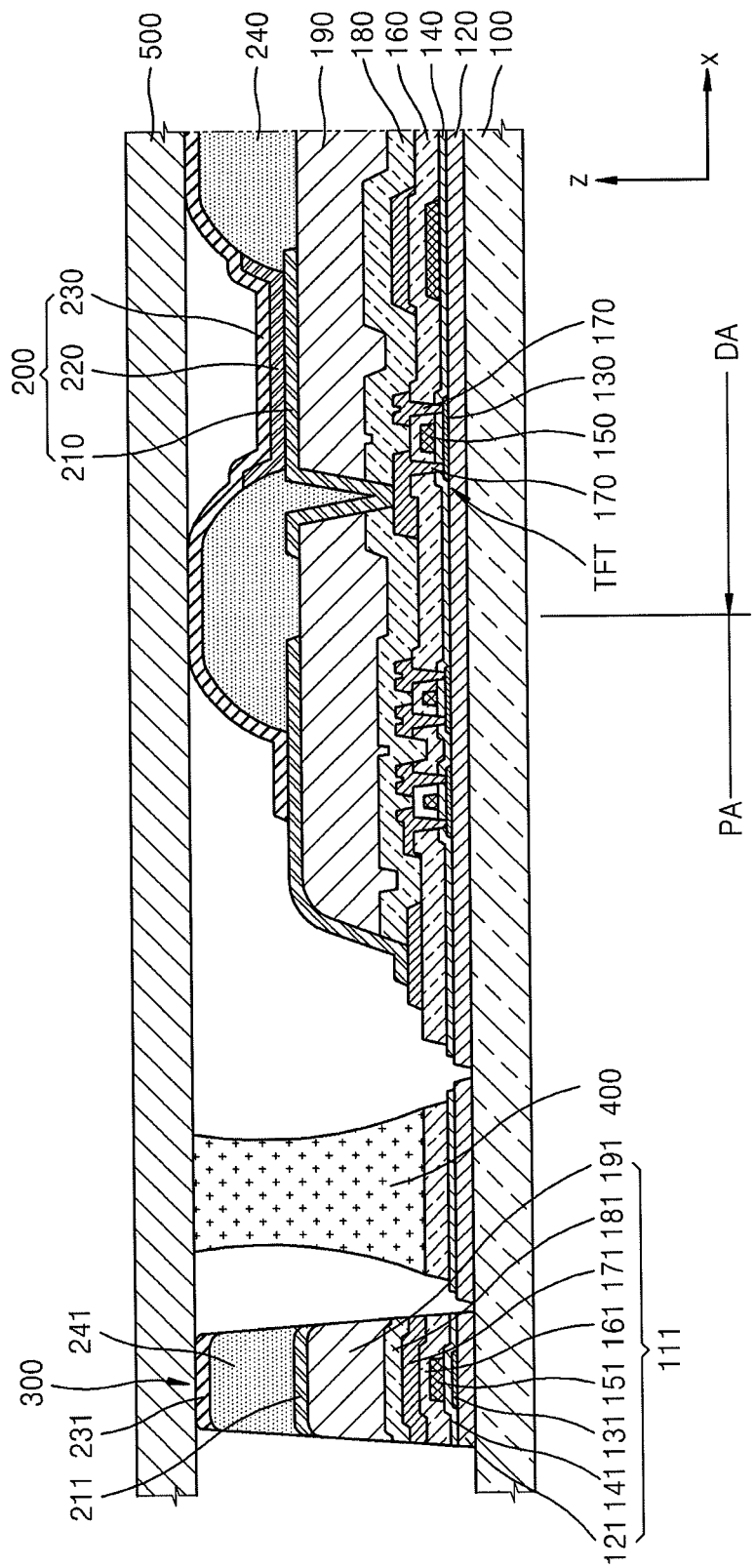
FIGS. 6 and 7 illustrate cross-sectional views of organic light-emitting display apparatuses according to embodiments.
Figure 7:
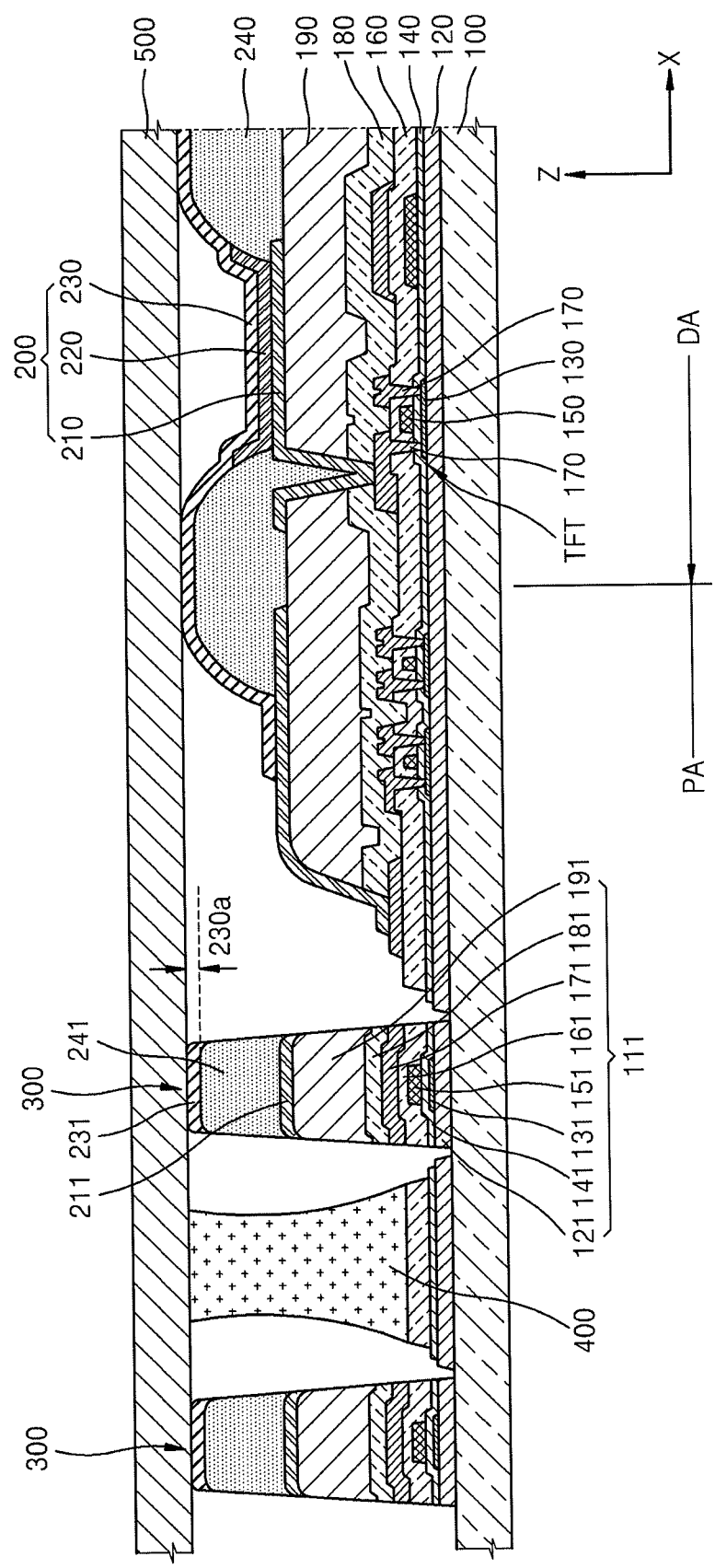

FIGS. 6 and 7 illustrate cross-sectional views of organic light-emitting display apparatuses according to embodiments. FIG. 6 illustrates an embodiment in which a shock absorption member 300 is separately disposed at an edge of a lower substrate 10 that is an opposite direction (−x) to the display area DA with reference to a sealing member 400. For example, FIG. 6 illustrates an embodiment in which the shock absorption member 300 is spaced apart from the display area DA at an outer side of the sealing member 400 such that the sealing member 400 is between the shock absorption member 300 and the display area DA. FIG. 7 illustrates an embodiment in which shock absorption members 300 are disposed at portions in both a direction (+x) of the display area DA and an opposite direction (−x) to the display area DA with reference to a sealing member 400. For example, FIG. 7 illustrates an embodiment in which the sealing member 400 is between a pair of shock absorption members 300, and one of the shock absorption members 300 is between the sealing member 400 and the display area DA. Below, the organic light-emitting display apparatus will be described focusing on FIG. 5.

Referring to FIG. 5, the organic light-emitting display apparatus may include a lower substrate 100, a TFT, a pixel electrode 210, a pixel defining layer 240, an intermediate layer 220, an opposite electrode 230, a shock absorption member 300, a sealing member 400, and an upper substrate 500.

In the organic light-emitting display apparatus according to an embodiment, the lower substrate 100 may have a display area DA and a peripheral area PA (that surrounds the display area DA), and the TFT may be on or in the display area DA of the lower substrate 100. A first insulating film 180 and a second insulating film 190 may be further provided on the TFT so as to protect the TFT or planarize the top surface of the TFT. A pixel electrode 210 may be provided on the second insulating film 190 such that the pixel electrode 210 is electrically connected to source and drain electrodes 170 of the TFT. An intermediate layer 220 (including an emission layer) may be on the pixel electrode 210, and an opposite electrode 230 (corresponding to or overlying the pixel electrode 210) may be on the intermediate layer 220.

A shock absorption member 300 may be in the peripheral area PA (that surrounds the display area DA) of the lower substrate 100. The shock absorption member 300 may be separated or spaced apart from the sealing member 400 by a predetermined distance. The shock absorption member 300 may include layers analogous to all layers in the display area DA of the lower substrate 100, e.g., of the TFT and the pixel. For example, the shock absorption member 300 may include a first layer 111 (having a layer stack structure), a second layer 241 (including the same material as the pixel defining layer 240), and a third layer 231 (including the same material as the opposite electrode 230). In an implementation, a metal layer 211 (including the same material as the pixel electrode 210) may be further provided between the first layer 111 and the second layer 241.

For example, the first layer 111 of the shock absorption member 300 may have a layer stack structure. The first layer 111 may include, e.g., a buffer layer 121, a gate insulating film 141, and an interlayer insulating film 161 (analogous to those layers constituting the TFT in the display area DA), and may include a semiconductor layer 131 between the buffer layer 112120 and the gate insulating film 141, a gate electrode 151 on the top surface of the semiconductor layer 131, a layer 171 including the same material as the source and drain electrodes 170, and a first insulating film 181 and a second insulating film 191 (analogous to those layers covering the TFT). As described above, the first layer 111 may further include the layers constituting the TFT provided in the display area DA, and the first insulating film 180 and the second insulating film 190 disposed to cover the TFT.

In an implementation, the end portion of the shock absorption member 300 (in the direction of or facing the upper substrate 500) may contact the upper substrate 500, as illustrated in FIG. 5. In an implementation, the end portion of the shock absorption member 300 (in the direction of or facing the upper substrate 500) may not contact, e.g., may be spaced apart from, the upper substrate 500. For example, when the third layer 231 (that is simultaneously formable with the opposite electrode 230) is not provided or is omitted, a space 230a may exist between the upper substrate 500 and the end portion of the shock absorption member 300 (in the direction of or facing the upper substrate 500).

As described above, the pixel defining layer 240 may be in the display area DA, and the shock absorption member 300 may have the second layer 241 as the uppermost layer, the second layer 241 being formed simultaneously with the pixel defining layer 240.

A distance from the lower substrate 100 to the end portion of the shock absorption member 300 (in the direction of or facing the upper substrate 500) may be equal to or about equal to a distance from the lower substrate 100 to the end portion of the pixel defining layer 240 (in the direction of or facing the upper substrate 500). In this case, the opposite electrode 230 on the pixel defining layer 240 may contact the upper substrate 500, and the space 230a corresponding to the thickness of the opposite electrode 230 may exist between the upper substrate 500 and the end portion of the shock absorption member 300 (in the direction of or facing the upper substrate 500). The lower substrate 100 or the upper substrate 500 may have a thickness of several hundred μm, while the opposite electrode 230 may have a relatively small thickness of about 1,000 Å. Thus, even when the space 230a exists as described above, the end portion of the shock absorption member 300 (in the direction of or facing the upper substrate 500) may be considered as almost or substantially contacting or actually contacting the upper substrate 500 in terms of the entire surface of the organic light-emitting display apparatus.

A sealing member 400 may be on the lower substrate 100 such that the sealing member 400 is separated or spaced apart from the shock absorption member 300 by a predetermined distance. The sealing member 400 may be in the display area DA and/or in the peripheral area PA along an edge of the lower substrate 100. The lower substrate 100 and the upper substrate 500 may be attached to each other by the sealing member 400.

FIGS. 8 to 13 illustrate plan views of organic light-emitting display apparatuses according to embodiments. Referring to FIGS. 8 to 13, a sealing member 400 may be provided at edges of the display area DA and/or the peripheral area PA of the lower substrate 100. A shock absorption member 300 may be separated or spaced apart from the sealing member 400 by a predetermined distance. FIGS. 8 to 13 illustrate embodiments according to positions of the shock absorption member 300.

Figure 8:
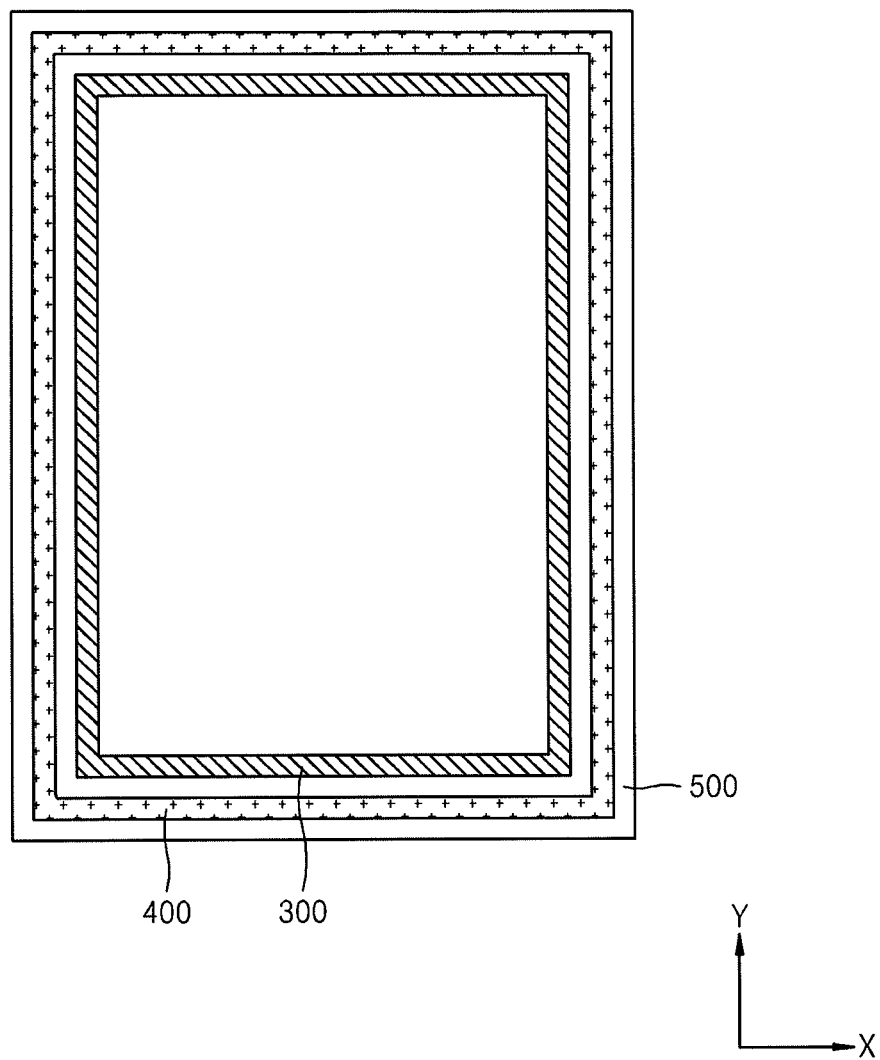
FIGS. 8 to 13 illustrate plan views of organic light-emitting display apparatuses according to embodiments.
Figure 9:
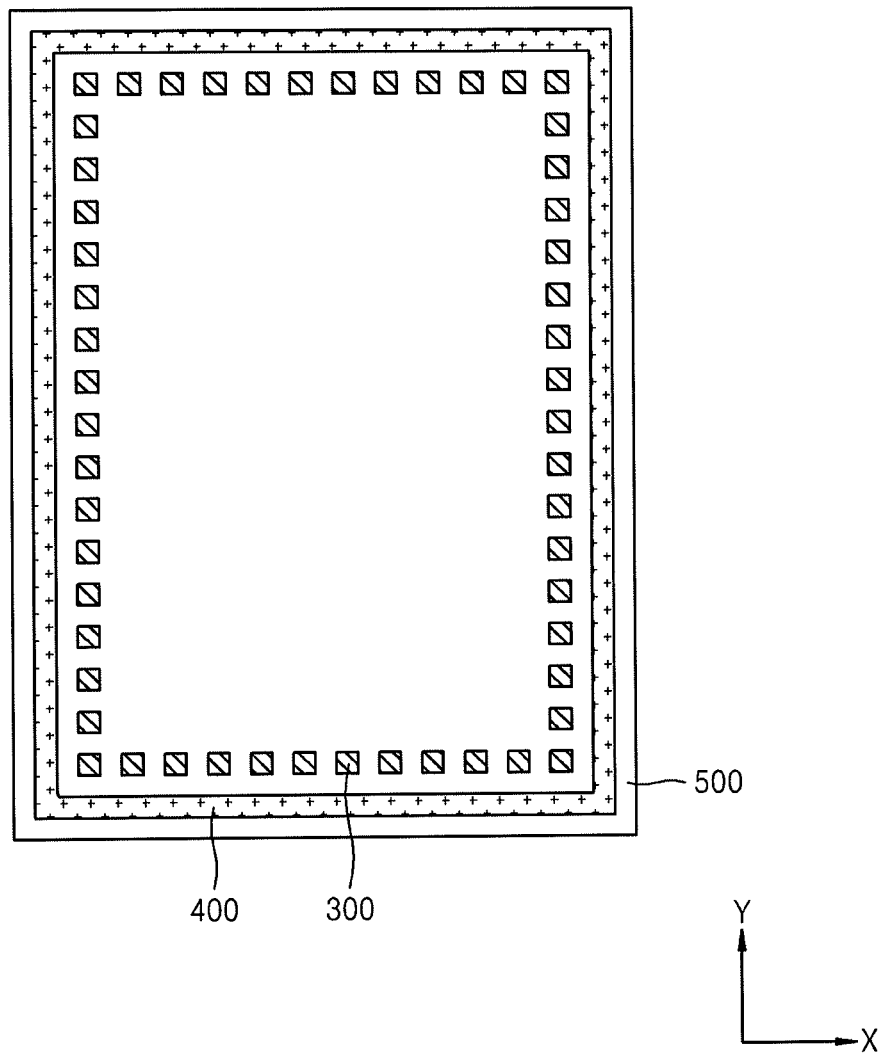

Referring to FIGS. 8 and 9, the shock absorption member 300 may be disposed in a direction (+x) of the display area DA with reference to the sealing member 400. For example, the shock absorption member 300 may be at an inner side of the sealing member 400 such that the shock absorption member 300 is between the sealing member 400 and the display area DA. In an implementation, the shock absorption member 300 may be discontinuously provided, as illustrated in FIG. 9.

Figure 10:
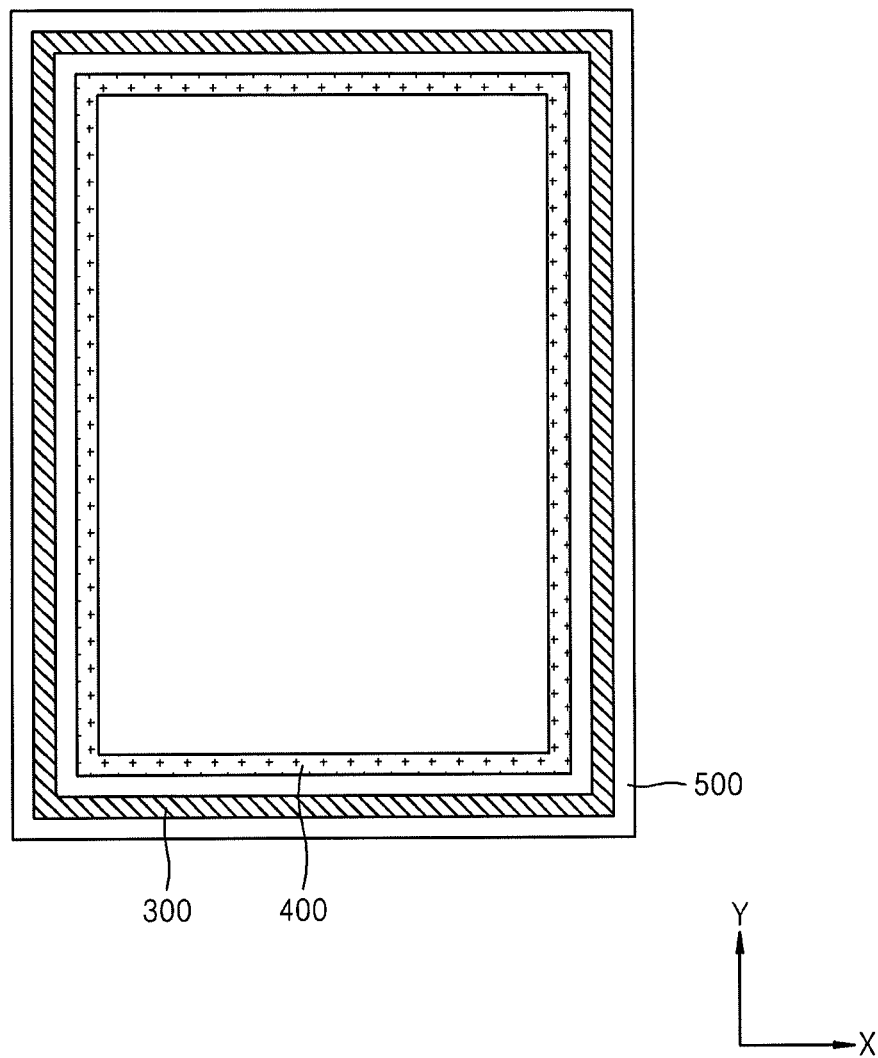
Figure 11:
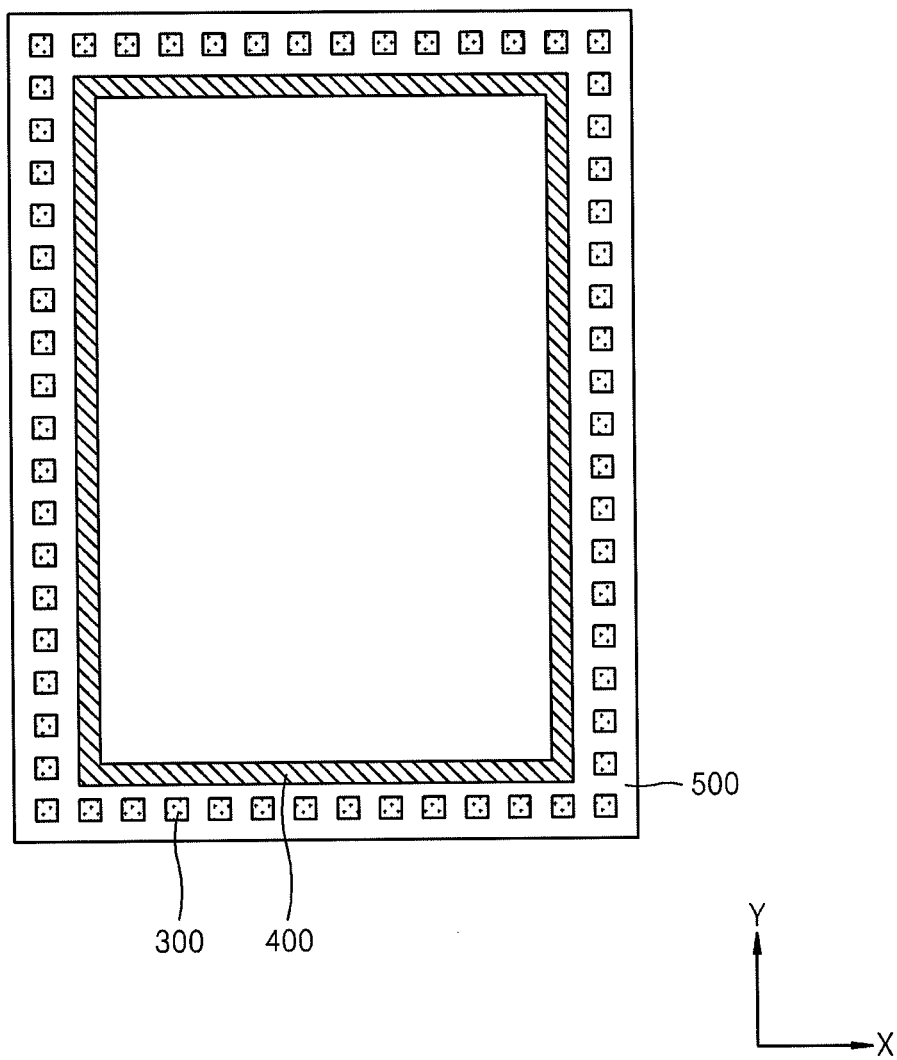

Referring to FIGS. 10 and 11, the shock absorption member 300 may be disposed in an opposite direction (−x) of the display area DA with reference to the sealing member 400. For example, the shock absorption member 300 may be at an outer side of the sealing member 400 such that the sealing member 400 is between the shock absorption member 300 and the display area DA. In an implementation, the shock absorption member 300 may be disposed at an endmost or outermost portion of the lower substrate 100. In an implementation, the shock absorption member 300 may be discontinuously provided, as illustrated in FIG. 11.

Figure 12:
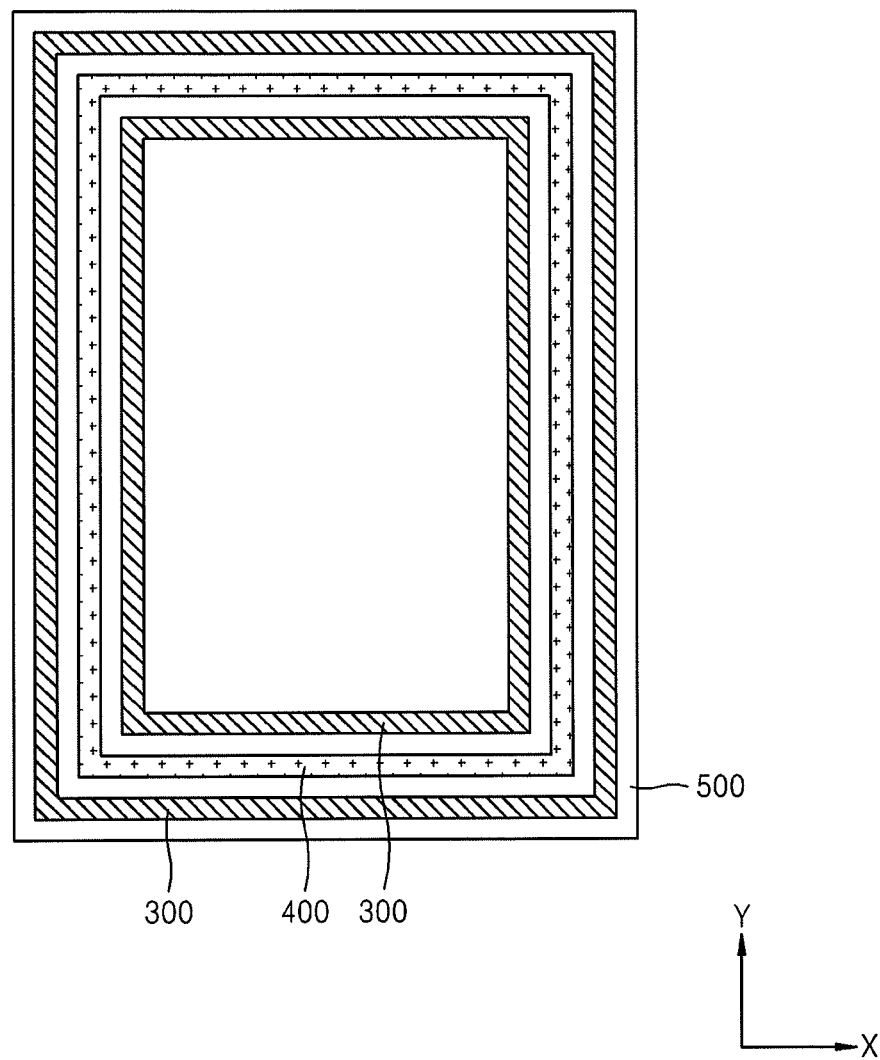
Figure 13:
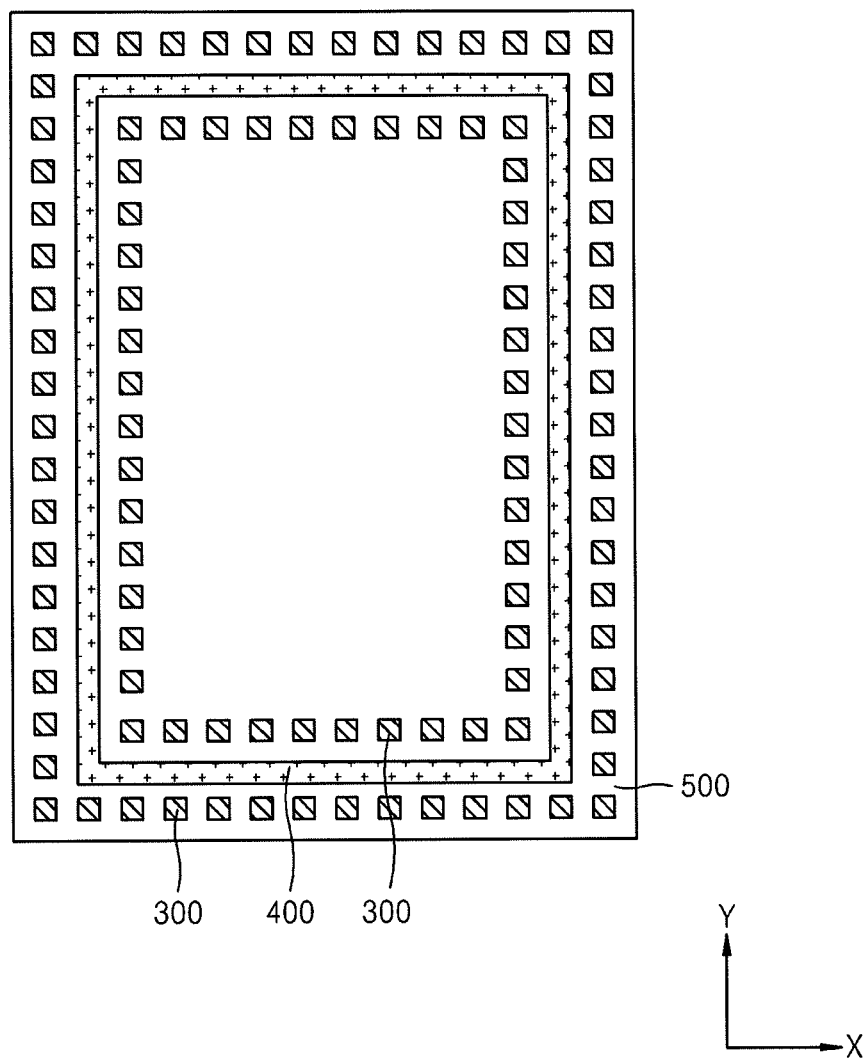

Referring to FIGS. 12 and 13, shock absorption members 300 may be disposed in both a direction (+x) of the display area DA and an opposite direction (−x) to the display area DA with reference to the sealing member 400. For example, a pair of the shock absorption members 300 may respectively be at inner and outer sides of the sealing member 400 such that the sealing member 400 is between the pair of shock absorption members 300, and one of the shock absorption members 300 is between the sealing member 400 and the display area DA. In an implementation, the shock absorption members 300 may be discontinuously provided as illustrated in FIG. 13.

The organic light-emitting display apparatus according to another embodiment may include a lower substrate 100, an upper substrate 500, a sealing member 400, and a shock absorption member 300.

The lower substrate 100 may include a display area DA and a peripheral area PA (that surrounds the display area DA). A TFT and an organic light-emitting device 200 may be on the display area DA. The upper substrate 500 may correspond to or overlie the lower substrate 100, and the upper substrate 500 and the lower substrate 100 may be attached to each other by the sealing member 400 therebetween. The sealing member 400 may be in the display area DA and/or the peripheral area PA of the lower substrate 100.

A shock absorption member 300 may be provided such that the shock absorption member 300 is separated or spaced apart from the sealing member 400 by a predetermined distance. The shock absorption member 300 may be in the display area DA and/or the peripheral area PA of the lower substrate 100 and may contact the upper substrate 500. In this case, the shock absorption member 300 may include the same layer structure as that between the lower substrate 100 and the upper substrate 500 within the display area DA of the lower substrate 100. In an implementation, the shock absorption member 300 may include the same layer structure as that of a portion having a maximum layer structure between the lower substrate 100 and the upper substrate 500 within the display area DA of the lower substrate 100.

The shock absorption member 300 of the organic light-emitting display apparatus may absorb external shocks applied to the organic light-emitting display apparatus.

For example, in a case where the organic light-emitting display apparatus is mounted and used in a portable mobile device, when the portable mobile device falls to the ground, a shock may occur in the edge of the organic light-emitting display apparatus. The shock may cause cracks from the peripheral area PA to the upper substrate 500, resulting in an extension of cracks from the upper substrate 500 to the display area DA.

However, the organic light-emitting display apparatus according to the present embodiment may help effectively reduce damage caused by the external shocks due to the presence of the shock absorption member 300 in the peripheral area PA. This may significantly reduce a damage rate of the organic light-emitting display apparatus which is caused by external shocks.

In addition, the shock absorption member 300 may be formed simultaneously with the TFT or the organic light-emitting device of the display area DA. Therefore, the shock absorption member 300 having a significantly low damage rate with respect to external shocks may be formed without additional processes.

By way of summation and review, an organic light-emitting display apparatus may be manufactured by forming organic light-emitting devices on a lower substrate and attaching the lower substrate to an upper substrate such that the organic light-emitting devices are disposed inside therebetween. The organic light-emitting display apparatus may be used as a display unit of a small product such as a mobile phone, or may be used as a display unit of a large product such as a television.

In the organic light-emitting display apparatus, a sealing member may be used to attach the lower substrate to the upper substrate. Some organic light-emitting display apparatuses may be easily damaged by external shocks.

The embodiments may provide an organic light-emitting display apparatus capable of reducing damage caused by external shocks.

As described above, according to the one or more of the above embodiments, it is possible to implement the organic light-emitting display apparatuses capable of reducing a damage rate caused by external shocks, and the methods for manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a lower substrate including a display area and a peripheral area, the peripheral area surrounding the display area;
   a thin film transistor (TFT) on the lower substrate;
   a pixel electrode electrically connected to the TFT;
   a pixel defining layer covering an edge of the pixel electrode so that a central portion of the pixel electrode is exposed;
   an intermediate layer on the pixel electrode, the intermediate layer including an emission layer;
   an opposite electrode overlying the pixel electrode;
   an upper substrate overlying the lower substrate;
   a sealing member on the peripheral area of the lower substrate, the sealing member attaching the lower substrate to the upper substrate; and
   a shock absorption member, the shock absorption member including:
   a first layer on the peripheral area of the lower substrate, the first layer being separated from the sealing member and being stacked in a layer stack structure on the lower substrate; and
   a second layer on the first layer, the second layer including a same material as the pixel defining layer.

2. The organic light-emitting display apparatus as claimed in claim 1, wherein:
   the first layer of the shock absorption member has a layer stack structure including layers formed of the same materials as layers included in the TFT, and
   the shock absorption member further includes a metal layer between the first layer and the second layer, the metal layer including a same material as the pixel electrode.

3. The organic light-emitting display apparatus as claimed in claim 2, wherein the shock absorption member further includes a third layer on the second layer, the third layer including a same material as the opposite electrode.

4. The organic light-emitting display apparatus as claimed in claim 1, wherein the shock absorption member is between the sealing member and the display area.

5. The organic light-emitting display apparatus as claimed in claim 1, wherein the sealing member is between the shock absorption member and the display area.

6. The organic light-emitting display apparatus as claimed in claim 1, wherein:
- the shock absorption member includes a pair of shock absorption members,
- the sealing member is between the pair of shock absorption members, and
- one of the shock absorption members is between the sealing member and the display area.

7. The organic light-emitting display apparatus as claimed in claim 1, wherein the shock absorption member surrounds the display area of the lower substrate.

8. The organic light-emitting display apparatus as claimed in claim 7, wherein the shock absorption member is discontinuously disposed around the display area of the lower substrate.

9. An organic light-emitting display apparatus, comprising:
- a lower substrate including a display area and a peripheral area, the peripheral area surrounding the display area;
- an upper substrate overlying the lower substrate;
- a sealing member on the peripheral area of the lower substrate, the sealing member attaching the lower substrate to the upper substrate; and
- a shock absorption member on the peripheral area of the lower substrate, the shock absorption member being separated from the sealing member, contacting the upper substrate, and having a same layer structure as a layer structure between the lower substrate and the upper substrate within the display area of the lower substrate.

10. The organic light-emitting display apparatus as claimed in claim 9, wherein the shock absorption member has a same layer structure as a structure of a portion having a maximum layer structure between the lower substrate and the upper substrate within the display area of the lower substrate.

* * * * *